United States Patent
Hidani et al.

(10) Patent No.: US 12,058,812 B2
(45) Date of Patent: Aug. 6, 2024

(54) SUBSTRATE FOR A PRINTED WIRING BOARD

(71) Applicant: SUMITOMO ELECTRIC INDUSTRIES, LTD., Osaka (JP)

(72) Inventors: Takuto Hidani, Osaka (JP); Kayo Hashizume, Osaka (JP); Haruka Okamoto, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 187 days.

(21) Appl. No.: 17/789,388

(22) PCT Filed: Jan. 15, 2021

(86) PCT No.: PCT/JP2021/001231
§ 371 (c)(1),
(2) Date: Jun. 27, 2022

(87) PCT Pub. No.: WO2021/149610
PCT Pub. Date: Jul. 29, 2021

(65) Prior Publication Data
US 2023/0039742 A1 Feb. 9, 2023

(30) Foreign Application Priority Data
Jan. 21, 2020 (JP) .................. 2020-007749

(51) Int. Cl.
*H05K 1/09* (2006.01)
*H05K 3/18* (2006.01)
*H05K 3/38* (2006.01)

(52) U.S. Cl.
CPC ............. *H05K 1/097* (2013.01); *H05K 3/181* (2013.01); *H05K 3/388* (2013.01);
(Continued)

(58) Field of Classification Search
CPC ........ B32B 27/34; B32B 15/08; H05K 1/097; H05K 3/181; H05K 3/388;
(Continued)

(56) References Cited

U.S. PATENT DOCUMENTS

2017/0347449 A1\* 11/2017 Sugiura .................... H05K 3/24
2018/0371191 A1\* 12/2018 Hashizume .......... H05K 1/0346
2021/0014978 A1\* 1/2021 Hashizume .............. H05K 1/03

FOREIGN PATENT DOCUMENTS

| JP | 2016-152405 A | 8/2016 |
| JP | 2018-029139 A | 2/2018 |
| JP | 2019-161016 A | 9/2019 |

\* cited by examiner

*Primary Examiner* — Timothy J Thompson
*Assistant Examiner* — Michael F McAllister
(74) *Attorney, Agent, or Firm* — Oliff PLC

(57) ABSTRACT

A substrate for a printed wiring board, the substrate includes a base film containing polyimide as a main component and a sinter layer disposed on at least a portion of a surface of the base film and containing copper nanoparticles. The base film contains a nitrogen atom bonded to a copper atom of the copper nanoparticles, an average number of the nitrogen atom bonded to the copper atom per unit area of the surface of the base film on which the sinter layer is disposed is $2.6 \times 10^{18}$ atoms/m$^2$ to $7.7 \times 10^{18}$ atoms/m$^2$, and the average number is an average number calculated for a measurement region estimated to have a thickness of 3 nm from a measurement value of the surface of the base film measured by X-ray photoelectron spectroscopy.

9 Claims, 2 Drawing Sheets

(52) U.S. Cl.
CPC ............... *H05K 2201/0154* (2013.01); *H05K 2203/072* (2013.01); *H05K 2203/1131* (2013.01)

(58) Field of Classification Search
CPC ..... H05K 2203/0723; H05K 2203/072; H05K 3/022; H05K 2203/113; H05K 2201/0154; H05K 2203/1131
USPC ........................................................ 174/257
See application file for complete search history.

SUBSTRATE FOR A PRINTED WIRING BOARD

TECHNICAL FIELD

The present disclosure relates to a substrate for a printed wiring board.

This application claims priority based on Japanese Patent Application No. 2020-7749 filed on Jan. 21, 2020, and the entire contents of the Japanese patent application are incorporated herein by reference.

BACKGROUND ART

In recent years, copper nano-ink in which copper nanoparticles are dispersed in a solvent such as water has been used for forming a metal layer or the like of a printed wiring board. The metal layer contains a sintered body of copper nanoparticles and is formed by baking a coating film formed on the surface of a base film by applying copper nano-ink (see Japanese Unexamined Patent Application Publication No. 2016-152405).

CITATION LIST

Patent Literature

PTL 1: Japanese Unexamined Patent Application Publication No. 2016-152405

SUMMARY OF INVENTION

A substrate for a printed wiring board of the present disclosure includes a base film containing polyimide as a main component, and a sinter layer disposed on at least a portion of a surface of the base film and containing copper nanoparticles. The base film contains a nitrogen atom bonded to a copper atom of the copper nanoparticles, an average number of the nitrogen atom bonded to the copper atom per unit area of the surface of the base film on which the sinter layer is disposed is $2.6 \times 10^{18}$ atoms/m$^2$ to $7.7 \times 10^{18}$ atoms/m$^2$, and the average number is an average number calculated for a measurement region estimated to have a thickness of 3 nm from a measurement value of the surface of the base film measured by X-ray photoelectron spectroscopy.

DESCRIPTION OF EMBODIMENTS

Figure 1:
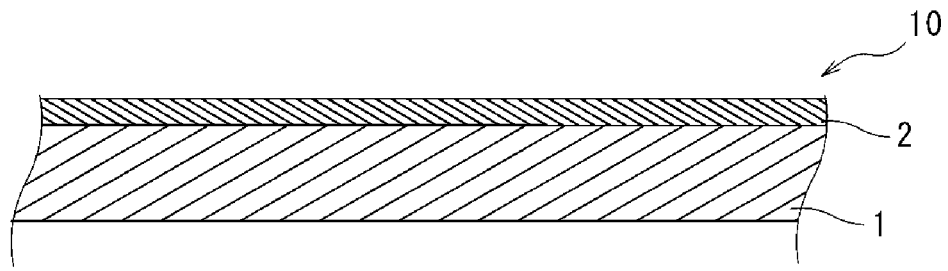
FIG. 1 is a schematic partial cross-sectional plane image of a substrate for a printed wiring board according to one embodiment.

Problems to be Solved by Present Disclosure

Copper nanoparticles contained in the copper nano-ink are easily oxidized by contact with dissolved oxygen or air in the ink. In addition, there is a tendency that oxidation of the copper nanoparticles proceeds even after application of the copper nano-ink, and the copper oxide concentration increases. The sinter layer formed by the copper nano-ink may cause a decrease in adhesion to the base film or a formation failure of a wiring portion, thereby causing a short circuit, a disconnection, an operation failure, or the like in a circuit. On the other hand, if the adhesive force is excessively strengthened, there is a problem that the etching property is deteriorated and the workability is lowered.

The present disclosure has been made in view of the above-described circumstances, and an object of the present disclosure is to provide a substrate for a printed wiring board having excellent adhesion between a sinter layer of copper nanoparticles and a base film and capable of improving etching properties.

Advantageous Effects of Present Disclosure

According to a substrate for a printed wiring board according to an aspect of the present disclosure, adhesion between a sinter layer of copper nanoparticles and a base film may be excellent, and etching properties may be improved.

Description of Embodiments of Present Disclosure

First, embodiments of the present disclosure are listed and described.

A substrate for a printed wiring board of present disclosure, the substrate includes a base film containing polyimide as a main component, and a sinter layer disposed on at least a portion of a surface of the base film and containing copper nanoparticles. The base film contains a nitrogen atom bonded to a copper atom of the copper nanoparticles, an average number of the nitrogen atom bonded to the copper atom per unit area of the surface of the base film on which the sinter layer is disposed is $2.6 \times 10^{18}$ atoms/m$^2$ to $7.7 \times 10^{18}$ atoms/m$^2$, and the average number is an average number calculated for a measurement region estimated to have a thickness of 3 nm from a measurement value of the surface of the base film measured by X-ray photoelectron spectroscopy.

In the substrate for a printed wiring board, an average number of a nitrogen atom bonded to a copper atom of copper nanoparticles per unit area of a base film by X-ray photoelectron spectroscopy is $2.6 \times 10^{18}$ atoms/m$^2$ or more. Accordingly, adhesion between the sinter layer of the copper nanoparticles and the base film may be increased. On the other hand, when the average number of nitrogen atom bonded to the copper atom of the copper nanoparticles is $7.7 \times 10^{18}$ atoms/m$^2$ or less, the bonding force between the copper atom of the copper nanoparticles and the nitrogen atom of the base film is in an appropriate range, and the etching property can be improved. Therefore, the substrate for a printed wiring board has excellent adhesion between the sinter layer and the base film, and may improve etching property. Here, the "average number of nitrogen atom" is an "average number of nitrogen atom" of a surface on which the sinter layer of the base film is stacked, and is based on a measurement value of the surface of the base film by X-ray photoelectron spectroscopy. The average number of the nitrogen atom is measured as follows. The operation of moving 1.4 mm in the width direction with a probe diameter of 100 μm for one place of the sample is set to 1 scan, and the number of integration for it is set to 10 times. Peaks are separated based on the average spectrum obtained. The average number of nitrogen atom is calculated on the assumption that the measurement region is a region having a thickness of 3 nm from the surface.

An average number of the nitrogen atom per unit area of the base film in the substrate for a printed wiring board may be $3.7 \times 10^{18}$ atoms/m² to $5.1 \times 10^{18}$ atoms/m². When the average number of nitrogen atom is within the above range, the adhesion between the sinter layer and the base film and the effect of suppressing the formation failure of the wiring portion may be further improved.

In the substrate for a printed wiring board, the surface of the base film on which the sinter layer is disposed has a surface-area increase ratio S of 0.3% to 8.5% determined by Formula 1 below:

$$S=[(SB-SA)/SA] \times 100 \qquad \text{Formula 1}$$

In Formula 1, SA is a projection surface area defined as an area of an image formed by projecting the surface of the base film onto a plane parallel to the surface, and SB is an actual surface area of an irregular surface of the base film measured using an atomic force microscope.

When a sinter layer is stacked on the base film, the surface roughness of the surface of base film on which sinter layer is stacked increases, and as a result, the surface area increases. When the surface-area increase ratio S of the base film is 0.3% to 8.5%, the adhesion between the sinter layer and the base film and the effect of suppressing the formation failure of the wiring portion may be further improved.

The surface-area increase ratio S of the base film on the substrate for a printed wiring board may be 1.5% to 6.0%. When the surface-area increase ratio S of the base film is within the above range, the adhesion between the sinter layer and the base film and the effect of suppressing the formation failure of the wiring portion may be further improved.

The sinter layer of the substrate for a printed wiring board may have an oxygen content of 15.0 atomic % or less. When the oxygen content is within the above range, the substrate for a printed wiring board may have more excellent adhesion between a sinter layer of copper nanoparticles and a base film.

The oxygen content of the substrate for a printed wiring board may be 5 atomic % or less. When the peel strength is within the above range, the adhesion between the sinter layer and the base film and the effect of suppressing formation failure of the wiring portion may be further improved.

In the substrate for a printed wiring board, a ratio of a number of the nitrogen atom bonded to the copper atom of the copper nanoparticles to a total number of nitrogen atoms of the polyimide in the surface of the base film on which the sinter layer is disposed may be 20% to 60%. According to this aspect, the bonding force between the copper atom of the copper nanoparticles and the nitrogen atom of the polyimide is in an appropriate range, and the etching property can be improved.

In the substrate for a printed wiring board, a ratio of a number of the nitrogen atom bonded to the copper atom of the copper nanoparticles to a total number of nitrogen atoms of the polyimide in the surface of the base film on which the sinter layer is disposed may be 25% to 45%. According to this aspect, the bonding force between the copper atoms of the copper nanoparticles and the nitrogen atoms of the polyimide is in an appropriate range, and the etching property can be improved.

The substrate for a printed wiring board, the substrate further include an electroless plating layer directly or indirectly disposed on a surface of the sinter layer, the surface being an opposite-side surface from the base film, and an electrolytic plating layer disposed on a surface of the electroless plating layer, the surface being an opposite-side surface from the sinter layer. With this aspect, the thickness of the metal layer can be further increased.

Details of Embodiments of Present Disclosure

Hereinafter, a substrate for a printed wiring board according to one embodiment of the present disclosure will be described in detail.

<Substrate for a Printed Wiring Board>

FIG. 1 is a schematic partial cross-sectional plane image of a substrate for a printed wiring board 10 according to one embodiment.

Figure 2:
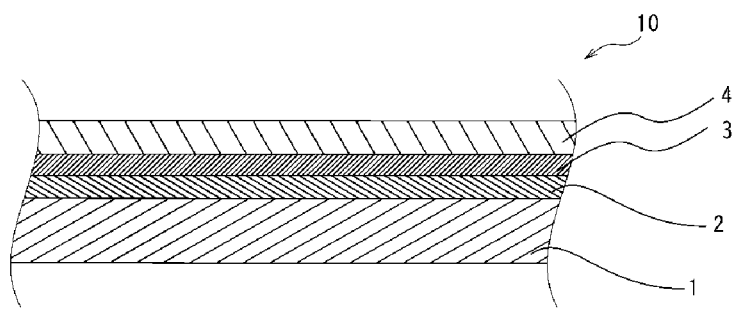
FIG. 2 is a schematic partial cross-sectional plane image of a substrate for a printed wiring board according to one embodiment.
Figure 3:
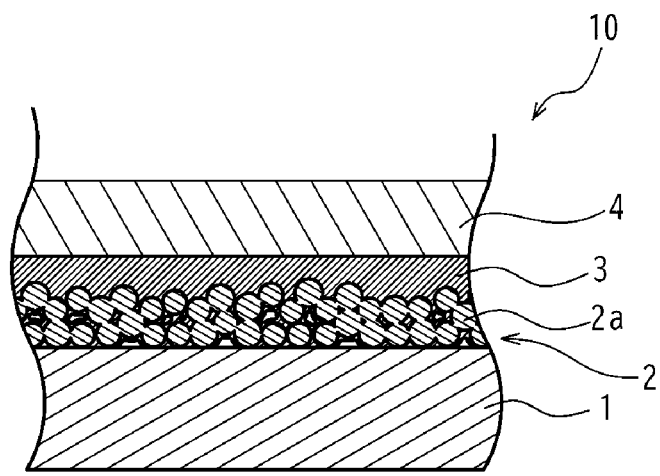
FIG. 3 is an enlarged image of the schematic partial cross-sectional plane image of FIG. 2.

As shown in FIG. 1, substrate for a printed wiring board 10 includes a base film 1 having an insulating property and a sinter layer 2 of copper nanoparticles stacked on a surface of base film 1. That is, sinter layer 2 is composed of a sintered body obtained by sintering the copper nanoparticles in the coating film of the copper nano-ink containing the copper nanoparticles. Also, as shown in FIG. 2, substrate for a printed wiring board 10 may further include an electroless plating layer 3 and an electrolytic plating layer 4 directly or indirectly on the surface of sinter layer 2. FIG. 3 is an enlarged image of FIG. 2. As shown in FIG. 3, copper nanoparticles 2a contained in sinter layer 2 maintain the particle shape.

[Base Film]

Base film 1 includes polyimide as a main component and has electrical insulation properties. Base film 1 is a base film for forming a conductive pattern. Base film 1 may be flexible. When base film 1 has flexibility, substrate for a printed wiring board 10 can be used as a flexible substrate for a printed wiring board. Since base film 1 includes polyimide as a main component, bonding force with a metal is large, and insulation and mechanical strength are excellent. The "main component" in base film 1 is a component having the largest content and refers to a component having a content of 50% by mass or more. In the present disclosure, the content of polyimide in base film 1 may be 75% by mass or more, and 95% by mass or more. In the present disclosure, base film 1 may contain substantially only polyimide.

As the polyimide, one produced by a conventionally known method can be used. For example, a polyimide precursor solution including polyamic acid and an organic solvent may be molded, and then heat treated to complete imidization, thereby manufacturing a polyimide film. As the polyimide film used in the present disclosure, a commercially available polyimide film which can be suitably used for various substrates such as a wiring substrate can be used. The polyimide film may be a single-layer film or a multilayer film in which two or more layers are laminated.

Examples of the polyimide include a polyimide synthesized from a tetracarboxylic acid component containing a component selected from pyromellitic dianhydride (PMDA), 3,3', 4,4'-biphenyltetracarboxylic dianhydride (s-BPDA), and the like as a main component, and a diamine component containing a component selected from 4,4-diaminodiphenyl ether (4,4-DADE), paraphenylenediamine (PPD), 3,4-diaminodiphenyl ether (3,4-DADE), and the like as a main component.

The lower limit of the average thickness of base film 1 may be 5 μm or 10 μm. On the other hand, the upper limit of the average thickness of base film 1 may be 50 μm or 40 μm. When the average thickness of base film 1 is less than 5 μm, the insulation strength of base film 1 may be insufficient. On the other hand, when the average thickness of base film 1 exceeds 50 μm, the printed wiring board may be unnecessarily thick or may have insufficient flexibility. The "average thickness" refers to an average value of thicknesses measured at arbitrary five points.

[Sinter Layer]

Sinter layer 2 is stacked on at least one surface of base film 1. Sinter layer 2 is a layer of a sintered body of copper nanoparticles 2a obtained by baking the plurality of copper nanoparticles 2a. Since sinter layer 2 is a layer of a sintered body of copper nanoparticles 2a, the conductivity of sinter layer 2 is increased, and the conductivity of substrate for a printed wiring board 10 is improved. Further, sinter layer 2 can be formed at low cost.

Sinter layer 2 may be formed by coating, for example, copper nano-ink on at least one surface of base film 1 and then drying and sintering the coating film.

The lower limit of the average thickness of sinter layer 2 may be 5 μm or 10 μm. On the other hand, the upper limit of the average thickness of sinter layer 2 may be 50 μm or 40 μm. When the average thickness of sinter layer 2 is less than 5 μm, the insulation strength of sinter layer 2 may be insufficient. On the other hand, if the average thickness of sinter layer 2 is more than 50 μm, substrate for a printed wiring board 10 may become unnecessarily thick.

<Average Number of Nitrogen Atom of the Base Film Bonded to Copper Atom of the Copper Nanoparticles>

In base film 1, copper atoms derived from copper nanoparticles 2a of sinter layer 2 are diffused in the surface on which at least sinter layer 2 is stacked. Some of the diffused copper atoms are bonded to nitrogen atoms. The nitrogen atoms are nitrogen atoms contained in polyimide which is a main component of the base film. The lower limit of the average number of the nitrogen atom bonded to the copper atom of copper nanoparticles 2a per unit area of the surface of the base film 1 on which the sinter layer is disposed may be $2.6 \times 10^{18}$ atoms/m² or $3.7 \times 10^{18}$ atoms/m². The upper limit of the average number of nitrogen atom may be $7.7 \times 10^{18}$ atoms/m² or $5.1 \times 10^{18}$ atoms/m². When the average number of nitrogen atom per unit area of base film 1 is $2.6 \times 10^{18}$ atoms/m² or more, the adhesive force between sinter layer 2 of copper nanoparticles 2a and base film 1 may be increased. On the other hand, when the average number of nitrogen atom bonded to the copper atom of copper nanoparticles 2a is $7.7 \times 10^{18}$ atoms/m² or less, the bonding force between the copper atom of copper nanoparticles 2a and the nitrogen atom of the polyimide is in an appropriate range, and the etching property can be improved. Accordingly, substrate for a printed wiring board 10 may have excellent adhesion between sinter layer 2 and base film 1 and may improve etching properties. The number of bonds between nitrogen atom and copper atom can be adjusted by adjusting the formation of copper oxide in the sinter layer.

X-ray photoelectron spectroscopy (ESCA: Electron Spectroscopy for Chemical Analysis) is an analysis method in which a sample surface is irradiated with soft X-rays under ultra-high vacuum, and the kinetic energy of photoelectrons emitted from the sample surface into the vacuum by the photoelectric effect is observed to obtain information on the elemental composition and chemical state of the sample surface. The "average number of nitrogen atom" is an average number of a nitrogen atom bonded to a copper atom of copper nanoparticles 2a per unit area of the surface of the base film on which the sinter layer is stacked, and is based on a measurement value of the surface of the base film by X-ray photoelectron spectroscopy. The average number of the nitrogen atom is measured as follows. The operation of moving 1.4 mm in the width direction with a probe diameter of 100 μm for one place of the sample is set to 1 scan, and the number of integration for it is set to 10 times. Peaks are separated based on the average spectrum obtained. The average number of nitrogen atom is calculated on the assumption that the measurement region is a region having a thickness of 3 nm from the surface.

The lower limit of the ratio of a number of a nitrogen atom bonded to a copper atom of copper nanoparticles 2a to a total number of nitrogen atoms of polyimide on the surface of base film 1 on which at least sinter layer 2 is stacked may be 20% or 25%. Meanwhile, the upper limit of the ratio of the number of nitrogen atom bonded to the copper atom of copper nanoparticles 2a may be 60%, 50%, or 45%. When the ratio of the number of nitrogen atom bonded to the copper atom of copper nanoparticles 2a is 20% or more, the adhesion between sinter layer 2 of copper nanoparticles 2a and base film 1 may be increased. In addition, since the effect of suppressing the generation of copper oxide is obtained, the bonding between the copper atom of copper nanoparticles 2a and the nitrogen atom of the polyimide is promoted, and the adhesive force between sinter layer 2 and base film 1 may be increased. On the other hand, when the ratio of the average number of nitrogen atom bonded to the copper atom of copper nanoparticles 2a is 60% or less, the bonding force between the copper atom of copper nanoparticles 2a and the nitrogen atom of the polyimide is in an appropriate range, and the etching property can be improved. The "the ratio of the number of the nitrogen atom bonded to the copper atom to a total number of the nitrogen atoms of polyimide on the surface of base film 1" is based on a measurement value of the surface of the base film by X-ray photoelectron spectroscopy. Note that the measurement region is approximately 3 nm from the surface.

<Surface-Area Increase Ratio of Base Film>

When sinter layer 2 is stacked on base film 1, the surface roughness of the surface of base film 1 on which sinter layer 2 is stacked increases, and as a result, the surface area increases. The lower limit of the surface-area increase ratio (SAD: Surface Area Difference) S of base film 1 may be 0.3%, 0.5%, or 1.0%. Meanwhile, the upper limit of the surface-area increase ratio S of base film 1 may be 8.5%, 7.5%, or 6.0%.

The surface-area increase ratio S of the base film may be obtained by Formula 1 below.

$$S=[(SB-SA)/SA] \times 100 \qquad \text{Formula 1}$$

In Formula 1, SA is a projection surface area defined as an area of an image formed by projecting the surface of the base film 1 onto a plane parallel to the surface. SB is an actual surface area of an irregular surface of the base film measured using an atomic force microscopy (AFM).

The surface-area increase ratio S indicates that as the numerical value approaches 0%, the difference between the numerical values of SB and SA decreases, and the surface of base film 1 is flat. The projection surface area represented by SA is an apparent plane area in a two dimensional direction obtained by projecting in a perpendicular direction of the hydrophilic film and ignoring irregularity of the surface of the hydrophilic film. The surface-area increase ratio S can be adjusted within a predetermined range by the water content of base film 1 and the copper nano-ink coating film after the alkali treatment as described later.

When sinter layer 2 is stacked on base film 1, the surface roughness of the surface of base film 1 on which sinter layer 2 is stacked increases, and thus the surface area increases. When the surface-area increase ratio S of base film 1 is within the above range, the adhesion between sinter layer 2 and base film 1 and the effect of suppressing the formation failure of the wiring portion may be further improved. When the surface-area increase ratio S of base film 1 is less than 0.3%, the adhesive force between the sinter layer of copper nanoparticles 2a and the base film may not be maintained. On the other hand, when the surface-area increase ratio S of base film 1 is more than 8.5%, the irregularity becomes large, and the etching property may be deteriorated.

Furthermore, when the surface-area increase ratio of base film 1 is within the above range, a physical interaction referred to as an anchor effect is increased, so that the adhesion between sinter layer 2 and base film 1 is improved, and the effect of suppressing the formation failure of the wiring portion can also be improved. Preferably, in the case where the number of nitrogen atom bonded to the copper atom and the surface-area increase ratio are adjusted within an appropriate range, the adhesion force and the etching property are maintained in a well-balanced manner, and thus workability and practicality are improved.

<Oxygen Content of the Sinter Layer>

The upper limit of the oxygen content in sinter layer 2 of copper nanoparticles 2a may be 15.0 atomic %, 10 atomic %, or 5 atomic %. When the oxygen content is more than 15.0 atomic %, the adhesion between the sinter layer of copper nanoparticles 2a and the base film may be insufficient. The oxygen content of sinter layer 2 is measured by an energy dispersive X-ray spectroscopy (EDS). Specifically, an irradiation region including sinter layer 2 is irradiated with an electron beam or an X-ray, and characteristic X-rays emitted from the irradiation region are subjected to element mapping analysis by EDS, thereby obtaining the oxygen content of sinter layer 2 of copper nanoparticles 2a. The lower limit of the oxygen content in sinter layer 2 of copper nanoparticles 2a is 0 atomic %. Alternatively, the oxygen content of sinter layer 2 of copper nanoparticles 2a may be more than 0 atomic %.

Substrate for a printed wiring board 10 can be used for manufacturing a printed wiring board by a subtractive method or a semi-additive method. That is, the printed wiring board manufactured by using substrate for a printed wiring board 10 has a conductive pattern including a layer obtained by patterning sinter layer 2.

[Method of Manufacturing Substrate for a Printed Wiring Board]

A method of manufacturing a substrate for a printed wiring board according to one embodiment of the present disclosure includes, for example, a step of coating a base film having an insulating property with the copper nano-ink (coating step), a step of drying the coating film of the copper nano-ink coated on the base film (drying step), and a step of baking the coating film after the drying step (baking step). In addition, the method for manufacturing a substrate for a printed wiring board according to one embodiment of the present disclosure may include a step of performing an alkali treatment on the base film (alkali treatment step) before the step of coating the base film with the copper nano-ink.

(Alkali Treatment Step)

Specifically, the alkali treatment step includes a step of treating the base film with an alkali solution by bringing the alkali solution into contact with a surface in which the coating step of the base film is to be performed, and a step of removing the alkali solution, before the coating step. By this alkali treatment step, the polyimide which is the main component of the base film is hydrophilized, and the imide ring is opened. In the present disclosure, copper atom of the copper nanoparticles can be bonded to nitrogen atom bonded to a carboxyl group formed by ring opening. Therefore, the bonding between nitrogen atom of polyimide and copper atom of copper nanoparticles is promoted, and the surface-area increase ratio of the base film is improved.

Therefore, the nitrogen atoms of the base film in the present disclosure are nitrogen atoms contained in the polyimide contained as the main component.

In the step of treating with an alkaline solution, the surface of the base film is treated by spraying the alkaline solution onto the surface of the base film or immersing the surface of the base film in the alkaline solution. Examples of the alkaline solution include an aqueous solution containing potassium hydroxide, sodium hydroxide, or the like. As the concentration of the alkaline liquid, for example, potassium hydroxide or sodium hydroxide is used in an amount of 10 g/L to 200 g/L.

The pH of the alkaline solution used in the alkali treatment step may be, for example, from 10 to 14. The contact time of the base film with the alkaline solution may be, for example, from 10 seconds to 4 minutes. The temperature of the alkaline solution may be, for example, from 30° C. to 50° C.

In the step of removing the alkaline solution, the base film is washed with water to remove the alkaline solution adhering to the surface of the base film.

In the step of removing the alkaline solution, the washing water is preferably dried after the washing. By evaporating the moisture in the base film, a water content of the base film is maintained within an appropriate range, and the formation of copper oxide and copper hydroxide can be suppressed, so that the average number of nitrogen atom bonded to the copper atom of the copper nanoparticles can be kept good. As a result, the bonding between the copper atom of the copper nanoparticles and the nitrogen atom of the polyimide is promoted, and the adhesive force is improved. The water content of the base film after the alkali treatment may be from 1.2% by mass to 2% by mass or may be from 1.3% by mass to 1.8% by mass.

(Coating Step)

In the coating step, the base film is coated with the copper nano-ink.

<Copper Nano-Ink>

The copper nano-ink contains copper nanoparticles. In addition, the copper nano-ink generally further includes a dispersant and a dispersion medium.

The lower limit of the average size of the copper nanoparticles may be 1 nm or 30 nm. On the other hand, the upper limit of the average size of the copper nanoparticles may be 500 nm or 100 nm. When the average size of the copper nanoparticles is smaller than 1 nm, there is a possibility that the dispersibility and stability of the copper nanoparticles in the ink may be deteriorated. On the other hand, when the average size of the copper nanoparticles is more than 500 nm, the copper nanoparticles may be easily precipitated, or the density of the copper nanoparticles may not be uniform when the ink is coated. By using the copper nanoparticles having an average particle diameter in the above range, the average thickness of sinter layer 2 can be reduced. As a result, it is possible to obtain a printed wiring board capable of promoting miniaturization. The average particle size can be measured by a particle size distribution measuring device (for example, "Microtrac particle size distribution meter UPA-150EX" manufactured by Nikkiso Co., Ltd.).

The lower limit of the content of the copper nanoparticles in the ink may be 5% by mass, 8% by mass, or 10% by mass. On the other hand, the upper limit of the content may be 50% by mass, 45% by mass, or 40% by mass. When the content is less than 5% by mass, it may be difficult to remove the dispersant or the dispersion medium in the baking step described later, or sinter layer 2 may be excessively thin. On the other hand, when the content exceeds 50% by mass, the copper nanoparticles may be easily aggregated in the ink.

The copper nanoparticles can be produced by a high-temperature treatment method, a liquid phase reduction method, a gas phase method, or the like. Among these methods, a liquid phase reduction method or a titanium redox method may be used.

Examples of the method for adjusting the particle diameter of the copper nanoparticles include a method of adjusting the types and blending ratios of the metal compound, the dispersant, and the reducing agent, and a method of adjusting the stirring speed, temperature, time, pH, and the like during the reduction reaction of the metal compound.

The dispersant favorably disperses the copper nanoparticles precipitated in the dispersion medium in the ink. From the viewpoint of preventing deterioration of sinter layer 2, the dispersant may not contain sulfur, phosphorus, boron, halogen, and alkali. Examples of such dispersants include amine-based polymer dispersants such as polyethyleneimine and polyvinylpyrrolidone, polycarboxylic acid-based polymer dispersants having a carboxylic acid group in the molecule such as polyacrylic acid and carboxymethylcellulose, and polymer dispersants having a polar group such as polyvinyl alcohol, styrene-maleic acid copolymers, olefin-maleic acid copolymers, and copolymers having a polyethyleneimine moiety and a polyethylene oxide moiety in one molecule.

The lower limit of the number average molecular weight of the dispersant may be 20,000 or 30,000. On the other hand, the upper limit of the number average molecular weight may be 300,000 or 250,000. When the number average molecular weight of the dispersant is within the above range, the copper nanoparticles can be favorably dispersed in the dispersion medium, and the resulting sinter layer 2 can be dense and free from defects. However, if the number average molecular weight is less than 20,000, the effect of preventing aggregation of the copper nanoparticles and maintaining dispersion may not be sufficiently obtained, and sinter layer 2 may not be dense and defects are not reduced. On the other hand, when the number average molecular weight exceeds 300,000, the dispersant becomes excessively bulky, and in a heat treatment performed after the ink coating, there is a concern that sintering of the copper nanoparticles may be interfered with and voids may be generated. In addition, since the dispersant becomes excessively bulky, there is a concern that the denseness of the film quality of sinter layer 2 may decrease, or the decomposition residue of the dispersant may decrease the conductivity of sinter layer 2.

The dispersion medium is one in which the copper nanoparticles are dispersed. As the dispersion medium, water is generally used. By using water as the dispersion medium, the dispersant is sufficiently swollen, and the copper nanoparticles surrounded by the dispersant can be favorably dispersed. If necessary, a water-soluble organic solvent may be further used. By further using a water-soluble organic solvent, it is possible to adjust the viscosity and vapor pressure of the dispersion.

The content ratio of the water may be from 20 parts by mass to 1900 parts by mass with respect to 100 parts by mass of the copper nanoparticles. When the water content ratio is less than the lower limit, the swelling effect of the dispersant may be insufficient. On the other hand, when the water content ratio exceeds the upper limit, the copper nanoparticles ratio in the ink decreases, and the thickness and density of sinter layer 2 may become insufficient.

Examples of the organic solvent include alcohols such as methyl alcohol, ethyl alcohol, n-propyl alcohol, isopropyl alcohol, n-butyl alcohol, isobutyl alcohol, sec-butyl alcohol, and tert-butyl alcohol; ketones such as acetone and methyl ethyl ketone; polyhydric alcohols such as ethylene glycol and glycerin and other esters; and glycol ethers such as ethylene glycol monoethyl ether and diethylene glycol monobutyl ether.

The content ratio of the organic solvent is preferably from 30 parts by mass to 900 parts by mass with respect to 100 parts by mass of the copper nanoparticles. When the content ratio of the water-soluble organic solvent is less than the lower limit, the effects of adjusting the viscosity and adjusting the vapor pressure of the dispersion may not be sufficiently obtained. On the other hand, when the content ratio exceeds the upper limit, the swelling effect of the dispersant becomes insufficient, and aggregation of the copper nanoparticles in the ink may easily occur.

The ink can be produced by blending copper nanoparticles, a dispersant, water as a dispersion medium, and if necessary, a water-soluble organic solvent at a predetermined ratio.

As a method of coating the base film with the copper nano-ink, for example, a conventionally known coating method such as a spin coating method, a spray coating method, a bar coating method, a die coating method, a slit coating method, a roll coating method, or a dip coating method can be used. Alternatively, only a part of the surface of the base film may be coated with the copper nano-ink by screen printing, a dispenser, or the like.

(Drying Step)

In the drying step, the coating film of copper nano-ink on the base film is dried. In the drying step, it is preferable to dry the coating film by blowing air to the coating film of the copper nano-ink in an environment of 40° C. to 60° C. By performing the air-blowing drying, the water content of the coating film is maintained in an appropriate range, and the generation of copper oxide and copper hydroxide can be suppressed. Therefore, the average number of nitrogen atom bonded to the copper atom of the copper nanoparticles can be favorably maintained. As a result, the bonding between the copper atom of the copper nanoparticles and the nitrogen atom of the polyimide during sintering is promoted, and the adhesive force is improved. The water content after coating is preferably from 18 g/cm$^2$ to 30 g/cm$^2$. In addition, it is preferable that the blowing speed is set not to wave the coating film. A specific speed of the hot air on a surface of the coating film can be set to, for example, from 5 m/second to 10 m/second. In addition, drying is preferably performed under a low oxygen concentration.

(Baking Step)

In this step, the copper nano-ink coated in the coating step is baked. As a result, the dispersant and other organic substances contained in the coated copper nano-ink are volatilized and decomposed to be removed, and as a result, the remaining copper nanoparticles are sintered and adhere to each other to be solid-bonded to form sinter layer 2 on at least one surface of base film 1.

The lower limit of the heating temperature in this step may be 150° C. or 200° C. On the other hand, the upper limit of the heating temperature may be 500° C. or 400° C. When the heating temperature is lower than 150° C., the adhesion between base film 1 and sinter layer 2 may not be sufficiently improved. On the other hand, when the heating temperature is more than 500° C., base film 1 may be deformed.

The baking time is not particularly limited, and may be, for example, from 30 minutes to 600 minutes.

In the method of manufacturing the substrate for a printed wiring board, a metal layer thicker than the sinter layer may be formed by further stacking a metal on the sinter layer of the copper nano-ink formed after the baking step by electroless plating or electroplating.

Other Embodiments

The embodiments disclosed herein are to be considered in all respects as illustrative and not restrictive. The scope of the present invention is not limited to the configuration of the above-described embodiment, but is defined by the scope of claims, and includes all modifications within the scope and meaning equivalent to the scope of claims.

Example

Hereinafter, the present invention will be described in more detail with reference to examples, but the present invention is not limited to these examples.
[Test Numbers No. 1 to No. 10]
[Production of Substrate for a Printed Wiring Board]
(Alkali Treatment Step)

The base film was immersed in a 40° C. 100 g/L aqueous sodium hydroxide as an alkali solution for 90 seconds, followed by washing with water, washing with 1% by mass aqueous acetic acid, washing with water, and drying in this order so as to perform an alkali treatment on a surface of the base film. The drying was performed under the drying conditions after the alkali treatment shown in Table 1.
(Coating Step)

A total of copper particles having an average size of 80 nm and a dispersant ("EPOMIN p-1000" manufactured by NIPPON SHOKUBAI CO., LTD.) was mixed with water as a dispersion medium in a mass ratio of 1:3 to prepare copper nano-ink. Next, a polyimide film ("APICAL (registered trademark) NPI" manufactured by KANEKA CORPORATION) having an average thickness of 25 μm was used, and the copper nano-ink was coated on one surface of the polyimide film.
(Drying Step)

The coating film of copper nano-ink was dried under the drying conditions described in Table 1.
(Baking Step)

Next, a sinter layer having an average thickness of 15 μm was formed by drying under conditions of a baking temperature of 350° C. and a baking time of 150 minutes, and substrates for a printed wiring board of No. 1 to No. 10 were produced.
(Water content of base film after alkali treatment and coating film of copper nano-ink)

The water content of the base film after the alkali treatment was measured using a heat drying type moisture meter. The water content of the copper nano-ink coating film before the baking step was calculated from the difference between the weight after vacuum drying and the weight after drying.
[Evaluation]
(Average Number and Bonding Ratio of a Nitrogen Atom Bonded to a Copper Atom of Copper Nanoparticles)

After the sinter layer was stacked, the average number of nitrogen atom being of polyimide on the surface of the base film and bonded to copper atom of the copper nanoparticles was measured by X-ray photoelectron spectroscopy. As measurement conditions, X-ray conditions were a probe size of 100 μm and an output of 100 W-20 kV. The X-ray incident angle with respect to the analysis surface was set to 90°, and the photoelectron extraction angle was set to 45°. For example, a scanning X-ray photoelectron spectrometer "QuanteraSXM" manufactured by ULVAC-PHI, Inc. was used as the measurement apparatus. From the average number of a nitrogen atom bonded to a copper atom of the obtained copper nanoparticles, the ratio of the number of a nitrogen atom bonded to a copper atom of the copper nanoparticles to the total number of nitrogen atoms of the polyimide on the surface of the base film was further determined. Here, the surface of the base film is a region having a thickness 3 nm from the surface of the base film on which the sinter layer is stacked.

Figure 4:
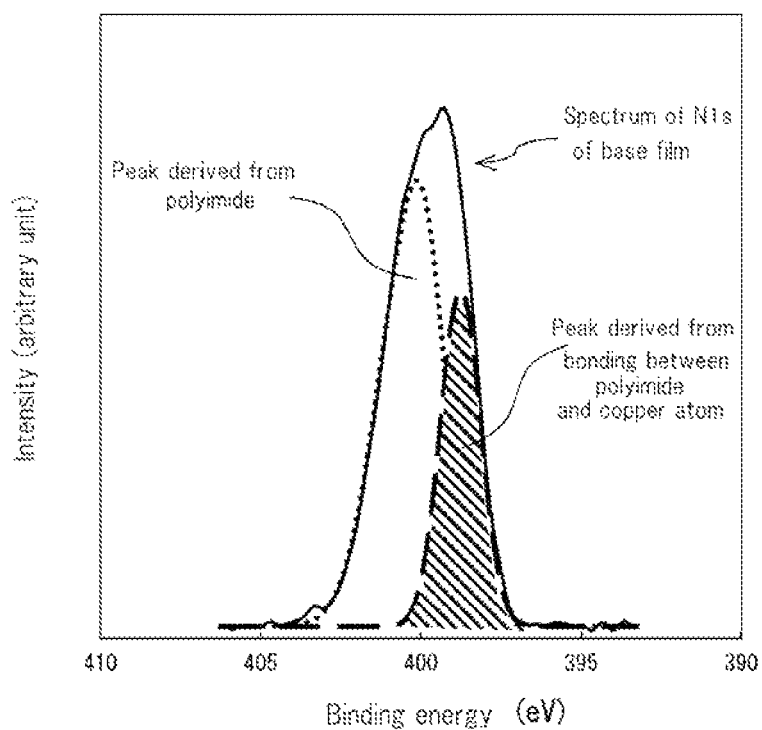
FIG. 4 is an image showing a result of measuring a substrate for a printed wiring according to one embodiment by X-ray photoelectron spectroscopy.

This will be described in more detail with reference to the spectrum of the N1 s (1 s trajectory of N) obtained by the X-ray photoelectron spectroscopy and the peak separation result thereof as shown in FIG. 4. In the graph, the vertical axis represents intensity (arbitrary unit) and the horizontal axis represents binding energy. The solid line represents the spectrum of N1 s, which is subjected to peak separation by the peaks of the dotted line and the dashed line. A dotted line indicates a peak derived from polyimide in the base film, a dashed line indicates a peak derived from bonding between polyimide and copper atoms, and the inside is emphasized by oblique lines. The number of bonds can be obtained by calculating the ratio of peaks derived from bonds from the two separated peaks obtained from the separation.

As a specific procedure for measuring the surface of the base film after stacking the sinter layer by X-ray photoelectron spectrometry, first, an etching solution to which cupric chloride dihydrate 50 g/L and hydrochloric acid 100 mL/L are added is prepared. Then, the copper substrate was immersed in the etchant at 30° C. to etch the copper, and then the surface of the base film was analyzed using a scanning X-ray photoelectron spectrometer.
(Surface-Area Increase Ratio of Base Film)

A base film from which the sinter layer was removed by etching using an aqueous iron chloride solution as an etchant was used as a sample.
Measurement Method: Atomic Force Microscope Analysis
Device Name: Dimension Icon with ScanAsyst, Veeco
Scanning rang: 5 μm×5 μm
Scan speed: 0.2 Hz
Scan mode: Tapping mode From the obtained image of the three dimensional surface shape, an actual surface area along the irregular surface of the base film and a projection surface area represented by an area of an image obtained by projecting the surface of the base film onto a plane parallel to the base film were calculated. Then, the surface-area increase ratio was calculated based on Formula 1 described above. The above measurement was performed once at each of two arbitrarily selected locations for each sample, and the average value of the locations excluding the contaminated portions was taken as the final surface area ratio.
(Oxygen Content of Sinter Layer)

The oxygen content of the sinter layer was determined by irradiating the sinter layer with an electron beam and performing elemental mapping analysis of characteristic X-rays emitted from the irradiated region using an energy dispersive X-ray spectrometer to determine the oxygen content in the sinter layer of the copper nanoparticles. To be specific, an energy dispersive X-ray spectrometer (JEM-2100 F manufactured by JEOL Ltd.) used for cross-sectional imaging was used to perform analysis at an acceleration voltage 200 kV, thereby measuring the contents of Cu, C, and O in a region near the interface surface between the base film and the metallic layer.

(Evaluation of Adhesive Strength Between Base Film and Sinter Layer)

For the substrates for a printed wiring board of No. 1 to No. 10, the peel strength immediately after production was measured for each substrate for a printed wiring board by a method according to JIS-K-6854-2 (1999) "Adhesive-Peel Strength Test Method-2:180° Peel". The adhesion between the base film and the sinter layer was evaluated in four levels of A to D. The adhesion between the base film and the sinter layer was evaluated according to the following criteria. The evaluation results of A and B are good. The evaluation results are shown in Table 1.

A: Peel strength is 8 N/cm or more.
B: Peel strength is 5 N/cm or more and less than 8 N/cm.
C: Peel strength is 3 N/cm or more and less than 5 N/cm.
D: Peel strength is less than 3 N/cm.

(Etching Property)

For the substrates for a printed wiring board of No. 1 to No. 10, an electroless plating layer having an average thickness of 0.4 μm was formed on the surface of the sinter layer by electroless plating. Next, a copper electroplating layer having an average thickness of 20 μm was formed on the surface of the electroless plating layer by copper electroplating, thereby forming a conductive layer including a sinter layer, an electroless plating layer, and a copper electroplating layer. Thereafter, the substrates for a printed wiring board of No. 1 to No. 10 were subjected to a flash etching treatment by a subtractive method using the dry resist film. Then, a test pattern in which lines having an average circuit width of 25 μm and an average circuit interval of 25 μm were arranged in parallel was formed to obtain printed wiring boards No. 1 to No. 10.

Next, after the flash etching treatment, an image was taken using a scanning electron microscope ("Flex-SEM1000" manufactured by Hitachi High-Technologies Corporation), and from the obtained image, the amount of skirt-like portion of the wiring portion of each of the printed wiring boards No. 1 to No. 10 was measured at 10 locations. Here, the "skirt-like portion" refers to a value of a difference between an upper base and a lower base of a wiring portion which is etched in a divergent shape from an upper plane toward a lower plane (base film side) of the wiring portion by etching in the circuit forming process and has a trapezoidal cross-sectional plane shape. Next, based on the average value of the measurement values at each of the 10 points, the degree of skirt-like portion was evaluated in the following four levels A to D. Of the above four grades, A and B are good as evaluation results. The evaluation results are shown in Table 1.

A: No skirt-like portion
B: Skirt-like portion is less than 0.5 μm.
C: Skirt-like portion is 0.5 μm or more and less than 2.0 μm.
D: Skirt-like portion is 2.0 μm or more.

TABLE 1

| Test numbers | | No. 1 | No. 2 | No. 3 | No. 4 |
|---|---|---|---|---|---|
| Bonding ratio of nitrogen atom and copper atom [%] | | 5 | 8 | 10 | 16 |
| Average number of nitrogen atom bonded to copper atom per unit area [atoms/m$^2$] | | $0.6418 \times 10^{18}$ | $1.0269 \times 10^{18}$ | $1.2837 \times 10^{18}$ | $2.0539 \times 10^{16}$ |
| Surface-area increase ratio of base film [%] | | 7.8 | 2.5 | 0.1 | 0.2 |
| Oxygen content of sinter layer [atm %] | | 0.5 | 18.0 | 19.0 | 17.5 |
| Coating-film drying step | Drying condition for coating film | 60° C. 60 min | 120° C. 120 min | 30° C. 40 min | 30° C. 60 min |
| | Water content of coating film of copper nano-ink [g/cm$^2$] | 13 | 9 | 37 | 35 |
| Film drying step | Drying conditions after alkali treatment | 150° C. 120 min | 40° C. 120 min | 30° C. 30 min | 30° C. 60 min |
| | Water content after alkali treatment step [mass %] | 0.5 | 1.5 | 2.5 | 2.4 |
| Evaluation | Peel strength between base film and sinter layer | C | D | D | D |
| | Etching property | D | A | A | A |
| | Overall evaluation | D | C | C | C |

| Test numbers | | No. 5 | No. 6 | No. 7 | No. 8 |
|---|---|---|---|---|---|
| Bonding ratio of nitrogen atom and copper atom [%] | | 24 | 29 | 35 | 38 |
| Average number of nitrogen atom bonded to copper atom per unit area [atoms/m$^2$] | | $3.0808 \times 10^{18}$ | $3.7227 \times 10^{18}$ | $4.4929 \times 10^{18}$ | $4.878 \times 10^{18}$ |
| Surface-area increase ratio of base film [%] | | 0.7 | 1.7 | 2.4 | 3.2 |
| Oxygen content of sinter layer [atm %] | | 7.5 | 4.8 | 3.2 | 1.2 |
| Coating-film drying step | Drying condition for coating film | 40° C. 90 min | 40° C. 120 min | 40° C. 150 min | 40° C. 180 min |
| | Water content of coating film of copper nano-ink [g/cm$^2$] | 25 | 22 | 20 | 18 |
| Film drying step | Drying conditions after alkali treatment | 40° C. 60 min | 60° C. 30 min | 40° C. 120 min | 40° C. 180 min |
| | Water content | 1.8 | 1.6 | 1.5 | 1.4 |

TABLE 1-continued

| | | | | | |
|---|---|---|---|---|---|
| Evaluation | Peel strength between base film and sinter layer after alkali treatment step [mass %] | B | A | A | A |
| | Etching property | A | A | A | A |
| | Overall evaluation | B | A | A | A |

| | | | | | |
|---|---|---|---|---|---|
| Test numbers | | No. 9 | No. 10 | No. 11 | No. 12 |
| Bonding ratio of nitrogen atom and copper atom [%] | | 40 | 50 | 62 | 70 |
| Average number of nitrogen atom bonded to copper atom per unit area [atoms/m$^2$] | | $5.1347 \times 10^{18}$ | $6.4184 \times 10^{18}$ | $7.9588 \times 10^{18}$ | $8.9860 \times 10^{18}$ |
| Surface-area increase ratio of base film [%] | | 0.2 | 5.5 | 8.4 | 9.5 |
| Oxygen content of sinter layer [atm %] | | 12.0 | 1.0 | 0.7 | 0.4 |
| Coating-film drying step | Drying condition for coating film | 40° C. 60 min | 60° C. 60 min | 60° C. 90 min | 70° C. 60 min |
| | Water content of coating film of copper nano-ink [g/cm$^2$] | 30 | 17 | 15 | 12 |
| Film drying step | Drying conditions after alkali treatment | 50° C. 180 min | 60° C. 60 min | 70° C. 90 min | 90° C. 60 min |
| | Water content after alkali treatment step [mass %] | 1.2 | 1.3 | 1.2 | 0.9 |
| Evaluation | Peel strength between base film and sinter layer | A | A | A | D |
| | Etching property | B | B | C | C |
| | Overall evaluation | B | B | C | D |

As shown in Table 1, in the substrates for a printed wiring board of No. 5 to No. 10 in which the average number of a nitrogen atom bonded to a copper atom of copper nanoparticles per unit area of the base film was $2.6 \times 10^{18}$ to $7.7 \times 10^{18}$ atoms/m$^2$, the adhesion between the sinter layer of copper nanoparticles and the base film and the etching property were good. Among them, the substrates for a printed wiring board of No. 6 to No. 8 in which the average number of the nitrogen atom per unit area of the base film was in the range of $3.7 \times 10^{18}$ atoms/m$^2$ to $5.1 \times 10^{18}$ atoms/m$^2$ or the ratio of the number of a nitrogen atom bonded to a copper atom of copper nanoparticles to the total number of nitrogen atoms of polyimide was in the range of 25% to 39% had particularly excellent adhesion between the sinter layer of copper nanoparticles and the base film and etching property.

On the other hand, in the substrates for a printed wiring board of No. 1 to No. 4 in which the average number of nitrogen atom bonded to the copper atom of the copper nanoparticles per unit area of the base film was less than $2.6 \times 10^{18}$ atoms/m$^2$, the adhesion between the sinter layer of the copper nanoparticles and the base film was very low. In addition, the substrates for a printed wiring board of No. 11 and No. 12 in which the average number of nitrogen atoms exceeded $7.7 \times 10^{18}$ atoms/m$^2$ had poor etching properties.

From the above results, it was shown that the substrate for a printed wiring board has excellent adhesion between a sinter layer of copper nanoparticles and a base film and can improve etching properties.

REFERENCE SIGNS LIST 1 base film
2 sinter layer
2a copper nanoparticles
3 electroless plating layer
4 electrolytic plating layer
10 substrate for a printed wiring board

The invention claimed is:

1. A substrate for a printed wiring board, the substrate comprising:
a base film containing polyimide as a main component; and
a sinter layer disposed on at least a portion of a surface of the base film and containing copper nanoparticles,
wherein the base film contains a nitrogen atom bonded to a copper atom of the copper nanoparticles,
an average number of the nitrogen atom bonded to the copper atom per unit area of the surface of the base film on which the sinter layer is disposed is $2.6 \times 10^{18}$ atoms/m$^2$ to $7.7 \times 10^{18}$ atoms/m$^2$, and
the average number is an average number calculated for a measurement region estimated to have a thickness of 3 nm from a measurement value of the surface of the base film measured by X-ray photoelectron spectroscopy.

2. The substrate for a printed wiring board according to claim 1, wherein the average number of the nitrogen atom bonded to the copper atom per unit area of the surface of the base film on which the sinter layer is disposed is $3.7 \times 10^{18}$ atoms/m$^2$ to $5.1 \times 10^{18}$ atoms/m$^2$.

3. The substrate for a printed wiring board according to claim 1, wherein the surface of the base film on which the sinter layer is disposed has a surface-area increase ratio S of 0.3% to 8.5% determined by Formula 1 below:

$$S = [(SB - SA)/SA] \times 100 \quad \text{Formula 1}$$

in Formula 1, SA is a projection surface area defined as an area of an image formed by projecting the surface of the base film onto a plane parallel to the surface, and SB is an actual surface area of an irregular surface of the base film measured using an atomic force microscope.

4. The substrate for a printed wiring board according to claim 3, wherein the surface-area increase ratio S is 1.5% to 6.0%.

5. The substrate for a printed wiring board according to claim 1, wherein the sinter layer has an oxygen content of 15.0 atomic % or less.

6. The substrate for a printed wiring board according to claim 5, wherein the oxygen content is 5 atomic % or less.

7. The substrate for a printed wiring board according to claim 1, wherein a ratio of a number of the nitrogen atom bonded to the copper atom of the copper nanoparticles to a total number of nitrogen atoms of the polyimide in the surface of the base film on which the sinter layer is disposed is 20% to 60%.

8. The substrate for a printed wiring board according to claim 1, wherein a ratio of a number of the nitrogen atom bonded to the copper atom of the copper nanoparticles to a total number of nitrogen atoms of the polyimide in the surface of the base film on which the sinter layer is disposed is 25% to 45%.

9. The substrate for a printed wiring board according to claim 1, the substrate further comprising:
- an electroless plating layer disposed on a surface of the sinter layer, the surface being an opposite-side surface from the base film; and
- an electrolytic plating layer disposed on a surface of the electroless plating layer, the surface being an opposite-side surface from the sinter layer.

* * * * *